(12) United States Patent
Sinangil et al.

(10) Patent No.: US 11,200,946 B2
(45) Date of Patent: Dec. 14, 2021

(54) LOW VOLTAGE BIT-CELL

(71) Applicant: Taiwan Semiconductor Manufacturing Company Limited, Hsinchu (TW)

(72) Inventors: Mahmut Sinangil, Campbell, CA (US); Hung-Jen Liao, Hsinchu (TW); Jonathan Tsung-Yung Chang, Hsinchu (TW); Yen-Huei Chen, Hsinchu County (TW); Yen-Ting Lin, San Jose, CA (US)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 17/087,711

(22) Filed: Nov. 3, 2020

(65) Prior Publication Data

US 2021/0050053 A1    Feb. 18, 2021

Related U.S. Application Data

(62) Division of application No. 16/138,250, filed on Sep. 21, 2018, now Pat. No. 10,847,214.

(60) Provisional application No. 62/562,668, filed on Sep. 25, 2017.

(51) Int. Cl.

| | |
|---|---|
| *G11C 11/419* | (2006.01) |
| *G11C 5/14* | (2006.01) |
| *G11C 8/16* | (2006.01) |
| *G11C 7/10* | (2006.01) |
| *G11C 11/413* | (2006.01) |

(52) U.S. Cl.
CPC .............. *G11C 11/419* (2013.01); *G11C 5/14* (2013.01); *G11C 7/1075* (2013.01); *G11C 8/16* (2013.01); *G11C 11/413* (2013.01)

(58) Field of Classification Search
CPC ....... G11C 11/419; G11C 5/14; G11C 7/1075; G11C 8/16; G11C 11/413
See application file for complete search history.

(56) References Cited

U.S. PATENT DOCUMENTS

| | | | |
|---|---|---|---|
| 7,589,555 B1 * | 9/2009 | Lewis | H03K 19/1735 326/38 |
| 9,224,446 B2 * | 12/2015 | Earle | G11C 8/16 |
| 9,721,624 B2 * | 8/2017 | Yeung | G11C 7/1012 |
| 10,050,045 B1 | 8/2018 | Hsu et al. | |
| 10,803,928 B2 * | 10/2020 | Sinangil | G11C 11/418 |
| 10,847,214 B2 * | 11/2020 | Sinangil | G11C 7/1075 |
| 2005/0036394 A1 | 2/2005 | Shiraishi | |
| 2013/0121087 A1 | 5/2013 | Liaw | |
| 2013/0194882 A1 | 8/2013 | Ishii et al. | |
| 2015/0357009 A1 | 12/2015 | Sinangil et al. | |
| 2019/0006372 A1 | 1/2019 | Lu et al. | |

* cited by examiner

*Primary Examiner* — Tri M Hoang
(74) *Attorney, Agent, or Firm* — Jones Day

(57) ABSTRACT

Systems and methods for a bit-cell are presented. The bit-cell comprises a read-port circuit and a write-port circuit. The read-port circuit comprises four transistors, wherein the read-port circuit is activated by a first threshold voltage. The write-port circuit comprises eight transistors, wherein the write-port circuit is activated by a second threshold voltage. The write-port circuit is coupled to the read-port circuit. The first threshold voltage and the second threshold voltage may be different and may be provided by a single supply voltage.

20 Claims, 12 Drawing Sheets

LOW VOLTAGE BIT-CELL

CROSS-REFERENCE TO RELATED APPLICATIONS

This application is a divisional application of U.S. patent application Ser. No. 16/138,250, filed Sep. 21, 2018, entitled "Low Voltage Bit-cell," which claims priority to U.S. Provisional Patent Application No. 62/562,668, filed Sep. 25, 2017 and entitled "Twelve-Transistor Low Voltage SRAM Bit-Cell," the entire contents of which are incorporated by reference herein.

FIELD

This application relates to a memory device and more particularly to its method of operation.

BACKGROUND

Memory designs that use six-transistor bit-cells tend to be compact, but typically cannot operate at low voltage levels because of writability, read-stability, and readability problems. For example, regarding writability, process variations can create active internal feedback on cross-coupled inverters such that a bit-cell tends to hold its previous state instead of allowing a write operation of new data. Regarding read-stability, six transistor bit cells operating at a low voltage level can experience distortion on the read bit-lines during a read operation. At lower voltages, the distortion is relatively large. The relatively large distortion can flip the bit-cell state, creating the read-stability problem. Readability issues can result from transistors operating more slowly at low voltages. When the bit-cell cannot drive the bit line in the expected amount of time, reads cannot be made within their designated windows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10B and 10C in combination depict a flow diagram for an unmasked write operation, in accordance with some embodiments.

DETAILED DESCRIPTION

Figure 1:
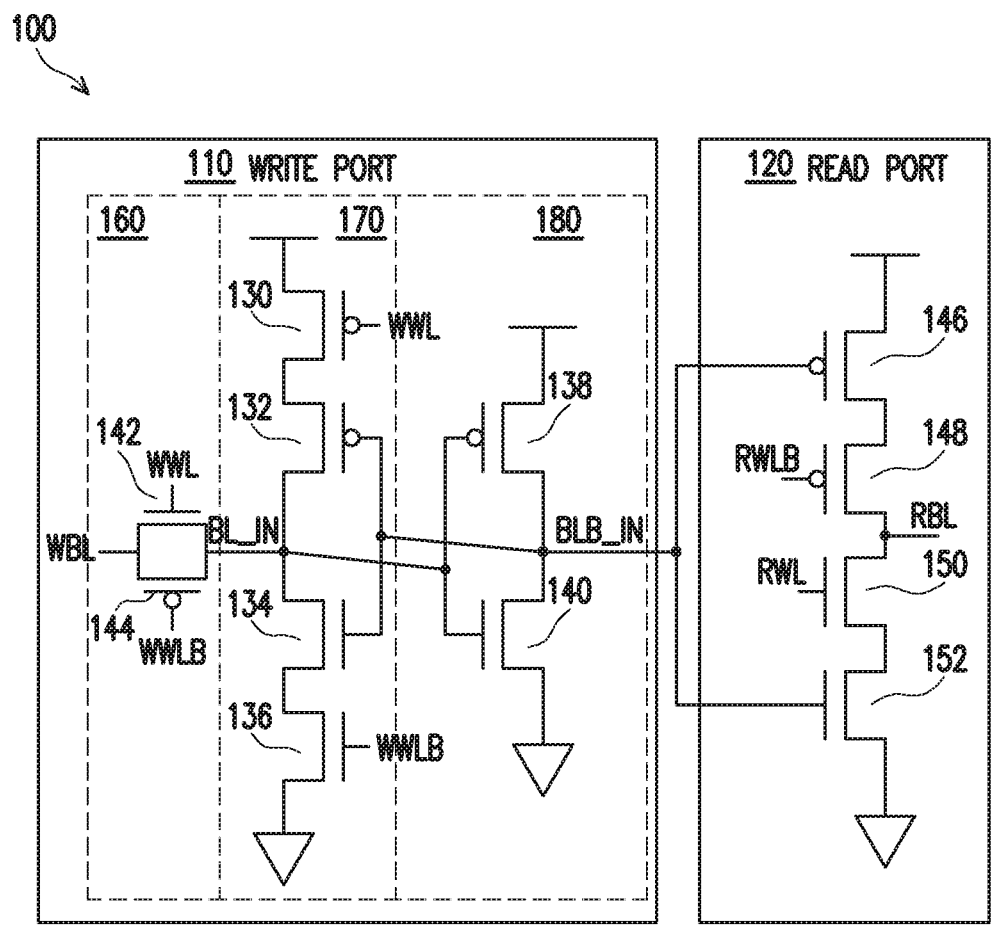
FIG. 1 depicts an example of a twelve transistor (12T) bit-cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Bit-cells, as described herein, including exemplary twelve-transistor (12T) bit-cells, can overcome the problems faced by other bit-cell designs. Systems and methods described herein include support circuitry that can be uniquely configured to facilitate read and write operations to the bit-cells described herein. In one example, power management circuitry is described that can operate in one of three modes and shut down certain parts of a memory depending on the mode of operation. Further, in some embodiments, the present disclosure provides: (1) low voltage operation; (2) faster operational speeds; (3) less leakage power; (4) improved read accuracy; and (5) flexibility in bit-cell tuning.

FIG. 1 depicts an example of a 12T bit-cell 100, in accordance with some embodiments. The 12T bit-cell comprises a write-port circuit 110 activated by a first threshold voltage and a read-port circuit 120 activated by a second threshold voltage. The write-port circuit 110 is coupled to the read-port circuit 120. The first threshold voltage in some instances may be different from the second threshold voltage, while in others it is not different from the second threshold voltage. The first and second threshold voltages may be selected from a group comprising: low voltage threshold (LVT), ultra low voltage threshold (ULVT), and high threshold voltage (HVT). The write-port circuit 110 and the read-port circuit 120 may be powered by the same supply voltage, or they may be powered by different supply voltages. The exemplary circuitry as shown is CMOS, but is not limited to CMOS technology.

The write-port circuit 110 comprises eight transistors, two of the transistors forming a CMOS complementary switch 160, four of the transistors forming a CMOS tri-state inverter 170, and two of the transistors forming a CMOS inverter 180. The role of the write-port circuit 110 is to facilitate a write operation to the bit-cell by allowing external circuitry to drive an input signal, e.g., on a "write bit-line," and retaining a value of the input signal. Example external circuitry for facilitating a write operation to the bit-cell is described with reference to FIGS. 3, 4, and 7. During a write operation, the bit to be written is placed on the write bit-line, labeled WBL. A "write word-line" signal labeled WWL goes high to commence writing to the cell, the CMOS complementary switch 160 is activated, and the WBL is driven onto an internal "bit-line in" node labeled BL_IN. The WBL signal is then inverted by the CMOS inverter 180 and driven onto the input of the CMOS tri-state inverter 170, which inverts the signal back to the value of the WBL. At the same time, the WBL signal is driven directly onto the output of the CMOS tri-state inverter 170. When the WWL signal goes low, the CMOS complementary switch 160 is no longer activated, but BL_IN retains its previous value. The previously inverted value of the WBL is input to the CMOS tri-state inverter 170 and inverted by the CMOS tri-state inverter 170 onto the BL_IN node. The inversions cancel each other out, and BL_IN retains the value of the WBL prior to the WWL going low. Thus, the bit-cell, namely the node, BL_IN, retains the value of the input signal WBL, driven by the external circuitry.

Regarding the transistor implementation of FIG. 1, in one embodiment, transistors 142 and 144 form the CMOS complementary switch 160. A CMOS complementary switch, also known as a transmission gate, comprises an n-MOS transistor and a p-MOS transistor. An input of the CMOS complementary switch is connected to a source of the p-MOS transistor, which is further connected to a drain of the n-MOS transistor. An output of the CMOS complementary switch is connected to a source of the n-MOS transistor, which is further connected to a drain of the p-MOS transistor. An input to the p-MOS transistor is connected to a complement of an input to the n-MOS transistor. When the input is active to the n-MOS transistor is high, and the n-MOS transistor is off, the input to the p-MOS transistor is low, and the p-MOS transistor is off. Thus, both transistors are either on or off simultaneously. When the transistors are both off, the output gets a high impedance value.

The transistor 142 comprises an n-MOS transistor, and the transistor 144 comprises a p-MOS transistor. The WWL is connected to an input of the transistor 142. A complement of the WWL, labeled WWLB, is connected to an input of the transistor 144. When the CMOS complementary switch is activated, the write bit-line WBL, is driven onto the node BL_IN.

Transistors 130, 132, 134, and 136 form the CMOS tri-state inverter 170. A tri-state inverter allows for three logic levels for its output port: 0, 1, and high impedance. When the enable signal is active, the output receives the inverted value of the signal on the input port. When the enable signal is not active, the output port is floating, and thus has a high impedance value. This allows other circuits or components of the circuit to share output lines.

The transistors 130 and 132 comprise p-MOS transistors, while the transistors 134 and 136 comprise n-MOS transistors. The write word-line WWL is connected to an input of the transistor 130, while the WWLB, is connected to an input of the transistor 136. An input of the transistor 132 is connected to an input of the transistor 134. A source of transistor 130 is connected to a first supply voltage, while a source of the transistor 136 is connected to a ground signal. The output of the CMOS tri-state inverter 170 is connected to the BL_IN.

The CMOS tri-state inverter 170 that comprises transistors 130, 132, 134, and 136 has an alternative configuration to a typical CMOS tri-state inverter. The inputs to the middle transistors (transistors 132 and 134) are connected to each other instead of the inputs to the end transistors (transistors 130 and 136) being connected to each other. When the enable signal, WWL, is 0, the output, BL_IN, is the inverted value of the signal on the input port. When the enable signal WWL is 1, the output, BL_IN, is connected to the write bit-line WBL.

Transistors 138 and 140 form the CMOS inverter 180. A CMOS inverter is comprised of an n-MOS transistor and a p-MOS transistor. The inputs of the two transistors are connected to each other. A source of the p-MOS transistor is connected to a supply voltage, while a source of the n-MOS transistor is connected to ground. A drain of the p-MOS transistor and a drain of the n-MOS transistor are connected to each other and further connected to an output of the inverter. When an input to the inverter is low, the output of the inverter is high; when the input to the inverter is high, the output to the inverter is low.

The transistor 138 comprises a p-MOS transistor, and the transistor 140 comprises an n-MOS transistor. A source of the transistor 138 is connected to the first supply voltage, while a source of transistor 140 is connected to the ground signal. An input of the CMOS inverter 180 is connected to the node BL_IN. Because inverters produce an inverted, or complementary output, an output of the CMOS inverter 180 is connected to a node labeled BLB_IN. The BLB_IN node is further connected to the inputs of transistors 132 and 134 in the CMOS tri-state inverter 170.

The 12T bit-cell 100 of FIG. 1 may mitigate writability issues faced by other designs. The combination of the transistors 130 and 136 break any internal feedback because they form open circuits when the WBL and the BL_IN are connected, thereby isolating the internal node, BL_IN. Furthermore, the transistors 142 and 144 form a transmission gate which can strongly pull low or pull high, which reduces delay between the input and the output and improves signal integrity in general.

The read-port circuit 120 is coupled to the write-port circuit 110. In addition to leveraging the transistors from the write-port circuit, the read-port circuit comprises another four transistors that form a CMOS inverter. The role of the read-port is to facilitate a read operation to the bit-cell by driving an output port that is connected to external circuitry with a value retained on an internal node. Example external circuitry is described with reference to FIGS. 3, 4, and 7. When the WWL goes high, the CMOS complementary switch is activated, and the value of WBL is driven onto the BL_IN node. The WBL signal is then inverted by the inverter and driven onto an input BLB_IN of the read port circuit 120. If a "read word-line," labeled RWL is high and BLB_IN is high (BL_IN is low), then RBL is low. If RWL is high and BLB_IN is low (BL_IN is high), then RBL is high. The inversions from the write port 110 inverter and the read port 120 inverter cancel each other out, and RBL is driven with the value of the internal node, BL_IN. Thus, the output port of the bit-cell, RBL, is driven with the value retained on the internal node, BL_IN, which is further provided to the external circuitry.

The read-port circuit 120 comprises four transistors 146, 148, 150, and 152. Transistors 146 and 148 comprise p-MOS transistors, while transistors 150 and 152 comprise n-MOS transistors. A source of the transistor 146 is connected to a second supply voltage. A source of transistor 152 is connected to ground. The RWL is connected to an input of the transistor 150. A complement of the read word-line, labeled RWLB, is connected to the transistor 148. An input of the transistor 146 is connected to an input of the transistor 152, which is further connected to BLB_IN from the write-port circuit 110, and more specifically to the output of the inverter of the write-port circuit 110. An output of the read-port circuit 120 is connected to a "read bit-line" node labeled RBL.

The example 12T bit-cell 100 of FIG. 1 may be able to overcome read-stability and readability issues faced by other designs. First, the full buffer decouples the read bit-line RBL from internal storage nodes, minimizing stability issues. Second, the read bit-lines can be pulled low or high by the transistors 146, 148, 150, and 152, avoiding the necessity to pre-charge RBL, and thus readability issues.

Figure 2:
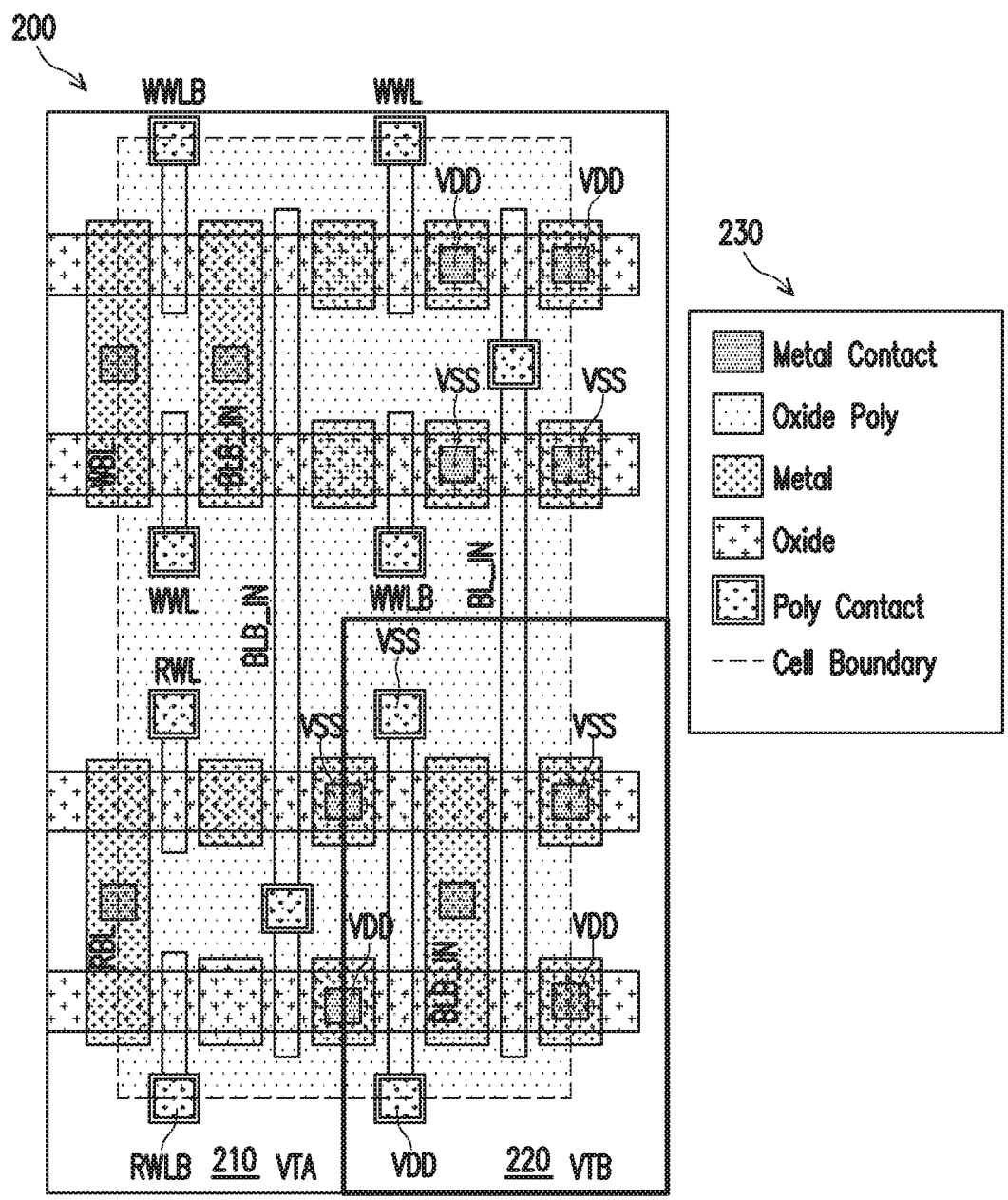
FIG. 2 depicts an example layout for a 12T bit-cell, in accordance with some embodiments.

FIG. 2 depicts an example layout 200 for a 12T bit-cell, in accordance with some embodiments. The layout 200 may be divided into two portions: a VTA portion 210 and a VTB portion 220. The VTA portion 210 and the VTB portion 220 can be powered by a same supply voltage VDD. The VTA portion 210 and the VTB portion 220 may operate at different threshold voltages. The threshold voltages may be chosen from a group comprising: LVT, ULVT, and HVT. A legend 230 indicates the layers in the layout, which include: metal contact, oxide poly, oxide, metal, and poly contact. The bit-cell boundary is indicated by a dotted line.

The layout 200 is four poly wide, resulting in relatively shorter bit-line signals. Oxide regions are continuous between bit-cells. Column-wise signals, i.e., bit-line signals, can be in a first metal layer. Row-wise signals, i.e., word-line signals, can be in a second metal layer. Input control signals to the write-port circuit and the read-port circuit, including WWL, WWLB, RWL, and RWLB, are applied to poly contacts in the bit-cell. Internal nodes to the bit-cell, including BL_IN, and BLB_IN, are connected to metal contacts. Additionally, the WBL input signal of the bit-cell is connected to metal and the RBL output signal of the bit-cell is connected to metal. The layout may be implemented without the need for edge cells. In other designs, edge cells may be used to separate memory transistors from other components. Edge cells may prevent substrate contamination.

Figure 3:
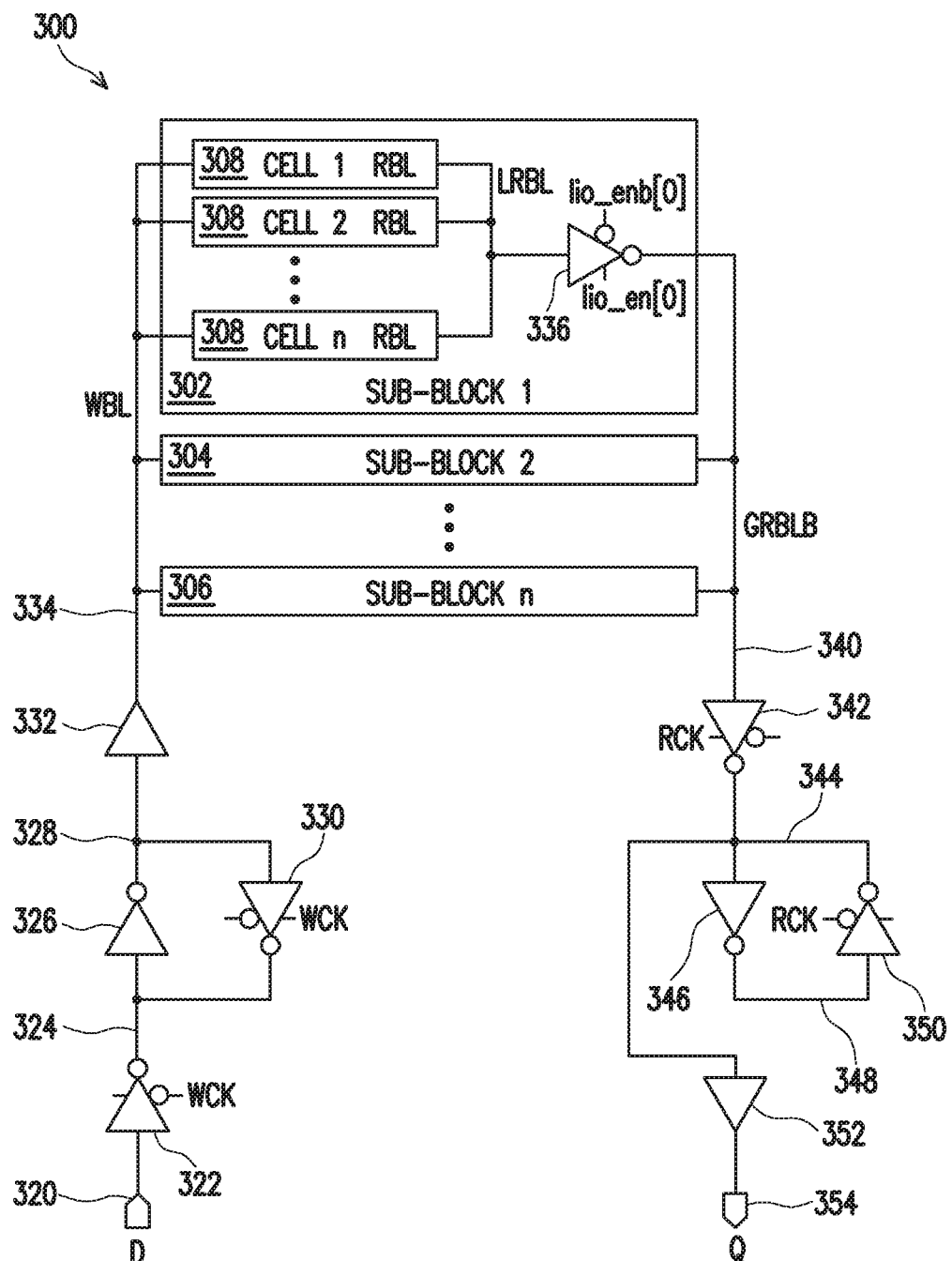
FIG. 3 depicts an exemplary embodiment of a 12T bit-cell in a memory circuit comprising read control circuitry and write control circuitry, in accordance with some embodiments.

FIG. 3 depicts an exemplary embodiment of a 12T bit-cell, e.g., the 12T bit-cell 100, in a memory circuit 300 comprising read control circuitry and write control circuitry, in accordance with some embodiments. The memory circuit 300 comprises write control circuitry, sub-blocks 1 through n, 302, 304, and 306, and read control circuitry. Each sub-block of the sub-blocks 1 through n comprises cells 1 through n. Each cell 308 of the cells 1 through n comprises a bit-cell, e.g., the bit-cell 100. A write bit-line input labeled WBL is provided to each cell 308. Each of the sub-blocks 302 outputs a local read bit line, labeled LRBL. For clarity, row-wise word-line drivers are not shown in FIG. 3.

The write control circuitry comprises components a tri-state inverter 322, an inverter 326, a tri-state inverter 330, and a buffer 332. The tri-state inverters 322 and 330 are enabled by an input latch clock, labeled WCK. When the tri-state inverter 322 is enabled by WCK, an input 320, is inverted and provided as an input 324 of the inverter 326 upon an edge of the WCK. The inverter 326 inverts the input 324 and provides a signal 328 to the buffer 332. The signal 328 is also provided to the tri-state inverter 330. When the tri-state inverter 330 is enabled by an edge of the WCK, the signal 328, is inverted and provided as an input of the inverter. The inverter 326 and tri-state inverter 330 work together as an input latch that stores previous data. The buffer 332 buffers the signal 328 onto a WBL node 334. Because the inversions cancel each other out, the value of input 320 is driven onto WBL.

Each of the sub-blocks 302, 304, and 306 outputs a local read bit line, labeled LRBL. In sub-block 302, the LRBL from cell 308 is provided to a tri-state inverter 336. When lio_enb[0] is high, the LRBL is inverted and driven onto a global read bit line complement, labeled GRBLB. The GRBLB signal is provided as an input 340 to the read control circuitry. A hierarchical structure, i.e., a local read bit line and a global read bit line, is shown as an example. The read path can also be a flat design.

The read control circuitry comprises a tri-state inverter 342, an inverter 346, a tri-state inverter 350, and a buffer 352. The GRBLB signal is provided as an input of the tri-state inverter 342. When the tri-state inverter 342 is enabled by an edge of the read latch clock RCK, the input 340, is inverted and provided as an input 344 of the inverter 346. The inverter 346 inverts the input 344 and provides a signal 348 to the tri-state inverter 350. When the tri-state inverter 350 is enabled by an edge of RCK, the signal 348, is inverted and provided as an input of the buffer 352. The inverter 346 and tri-state inverter 350 work together as an input latch that stores previous data. The buffer 352 buffers the input 344 to an output 354.

Figure 4:
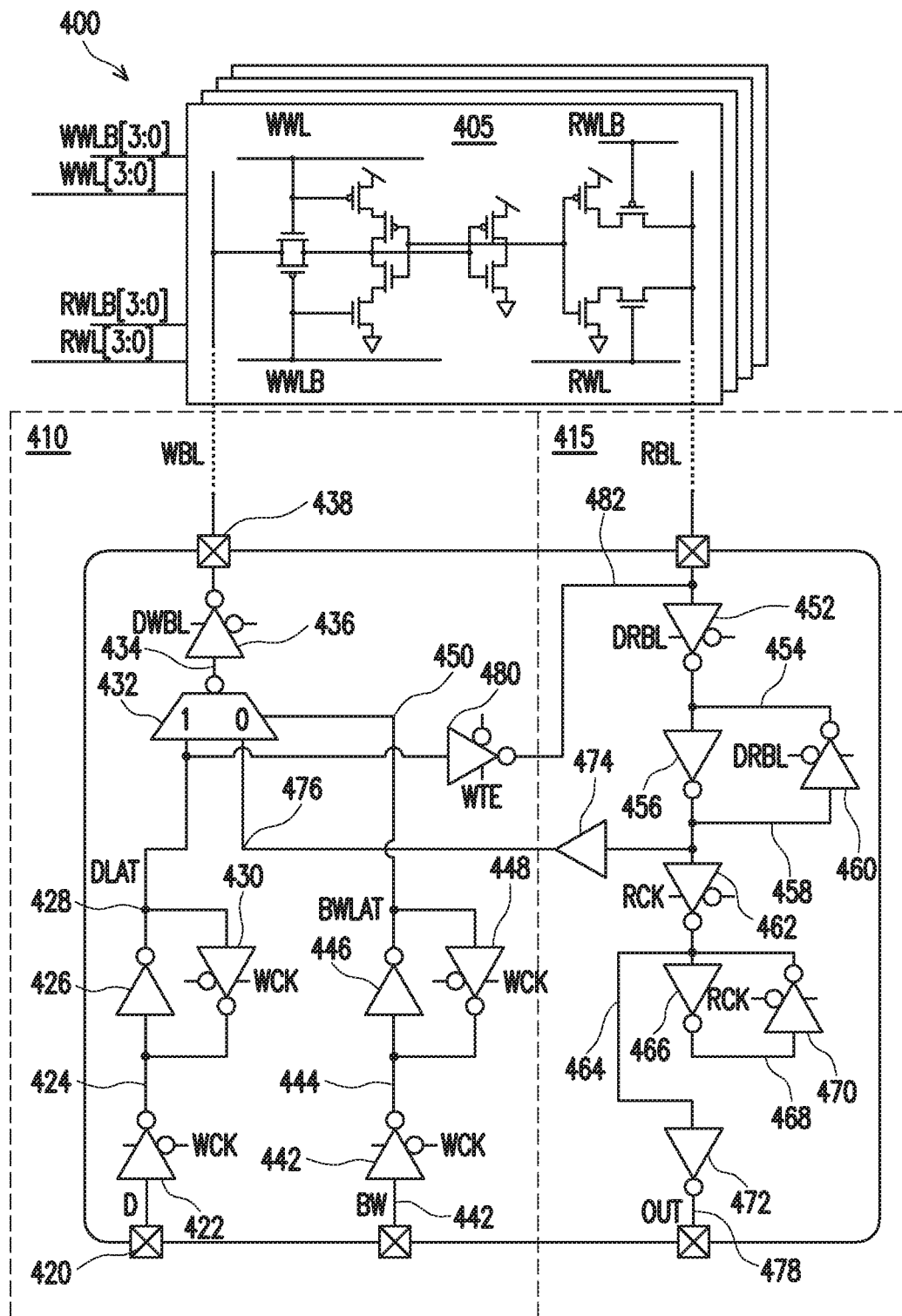
FIG. 4 depicts an exemplary embodiment of a 12T bit-cell in a memory circuit comprising read control circuitry and write control circuitry with additional features, in accordance with some embodiments.

FIG. 4 depicts an exemplary embodiment of a 12T bit-cell 405 in a memory circuit 400 comprising write control circuitry 410 and read control circuitry 415 with additional features, e.g., a feedback path between the read control circuitry and the write control circuitry that includes a path for a bit-write input, in accordance with some embodiments. These additional features support a read-modify-write operation. The cascaded boxes at the top of FIG. 4 represent 4 bit-cells: bit-cell 3, bit-cell 2, bit-cell 1, and bit-cell 0. Signals WBL, WWL[3:0], WWLB[3:0], RWL [3:0], and RWLB[3:0] are provided as inputs to the bit-cells. Signal RBL is an output from the bit-cell 1.

The write control circuitry 410 helps to support bit-write operation by facilitating a read-modify-write operation. At a high-level, a read-modify-write operation can be described as follows: (1) perform a read to the write address and store the data; (2) depending on bit-mask information, select input data or stored data and drive the write bit-line accordingly; (3) perform a write operation to the write address. Unmasked bits will be overwritten with new data. Masked bits will write the previous data again, preventing data loss.

The write control circuitry 410 comprises a tri-state inverter 422, an inverter 426, a tri-state inverter 430, an inverting multiplexer 432, a tri-state inverter 436, and a tri-state inverter 480. When the tri-state inverter 422 is enabled, upon an edge of the write latch clock WCK, an input 420, is inverted and provided as an input 424 of the inverter 426. The inverter 426 inverts the input 424 and provides a signal 428 to the inverting multiplexer 432. The signal 428 is also provided to the tri-state inverter 430. When the tri-state inverter 430 is enabled upon an edge of WCK, the signal 428, is inverted, and the inverted signal is provided as an input of the inverter 426. The inverter 426 and tri-state inverter 430 work together as an input latch that stores previous data. The inverting multiplexor 432 inverts the signal 428 if a control signal 450 labeled BWLAT is high. An inverted signal 434 is provided to an input of the tri-state inverter 436. When the tri-state inverter 436 is enabled by DWBL, the signal 434, is inverted and provided onto a WBL node 438.

The control signal 450 provided to the inverting multiplexor 432 is formed by the bit-write input path. The bit-write input path circuitry comprises a tri-state inverter 442, an inverter 446, and a tri-state inverter 448. A bit-write signal 440, labeled BW, is input to the tri-state inverter 442. When the tri-state inverter 442 is enabled by an edge of WCK the bit-write signal 440, is inverted and provided as an input 444 of the inverter 442. The inverter 446 inverts the input 444 and provides the signal BWLAT 450 to the tri-state inverter 448. When the tri-state inverter 448 is enabled by an edge of WCK, the signal 444, is inverted and provided as an input of the inverter 446. The inverter 446 and tri-state inverter 448 work together as an input latch that stores previous data. The signal 450 is also provided to the inverting multiplexor 432. The inverting multiplexor 432 inverts a signal 476 if BWLAT 450 is low. The tri-state inverter 480, which is enabled by a write-through enable signal WTE, is discussed with reference to FIG. 5.

The read control circuitry 415 comprises a tri-state inverter 452, an inverter 456, a tri-state inverter 460, a tri-state inverter 462, an inverter 466, a tri-state inverter 470, an inverter 472, and a buffer 474. The RBL signal is provided as an input 450 to the read control circuitry, specifically to the tri-state inverter 452. When the tri-state inverter 452 is enabled by a "drive read bit-line" signal labeled DRBL, an input 482, is inverted and provided as an input 454 of the inverter 456. The inverter 456 inverts the input 454 and provides a signal 458 to the tri-state inverter 462, the buffer 474, and the tri-state inverter 460. The inverter 456 and the tri-state inverter 460 work together as an input latch that stores previous data. When the tri-state inverter 462 is enabled by RCK, the signal 458, is inverted and provided as an input 464 of the inverter 466 and the inverter 472. The inverter 466 inverts the input 464 and provides a signal 468 to the tri-state inverter 470. The inverter 466 and the tri-state inverter 470 work together as an input latch that stores previous data. The inverter 472 inverts the input 464 and provides an output signal 478.

The buffer 474 buffers the signal 458 and provides an input 476 to the inverting multiplexer 432. When the control signal BWLAT to the multiplexer has a value of 0, the input 476 is inverted and provided as the inverted output 434 of the inverting multiplexor.

Figure 5:
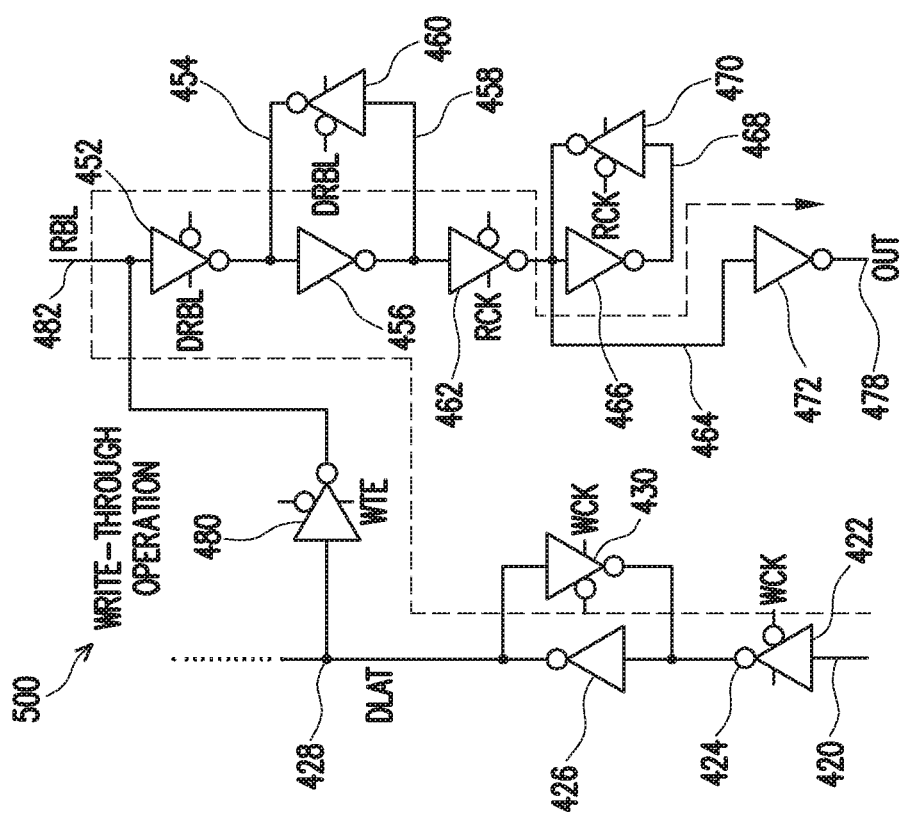
FIG. 5 depicts an exemplary control circuit and the path taken by a signal during a synchronous write-through operation, in accordance with some embodiments.

FIG. 5 depicts an exemplary control circuit 500 and the path taken by a signal during a synchronous write-through operation, in accordance with some embodiments. The control circuit 500 includes components from FIG. 4 that are used in the synchronous write-through operation. Synchronous write-through can be supported in a 12T bit-cell design by adding a path from the data latch to a point in read path. An example is shown where input data is driven to RBL through a tri-state inverter when the write-through enable signal WTE is enabled.

When the tri-state inverter 422 is enabled, upon an edge of the write latch clock WCK, an input 420, is inverted and provided as an input 424 of the inverter 426. The inverter 426 inverts the input 424 and provides a signal 428 to the tri-state inverter 430. The inverter 426 and tri-state inverter 430 work together as an input latch that stores previous data. The output 428 of the latch is provided to a tri-state inverter 480. When the tri-state inverter 480 is enabled by a write-through enable signal WTE, the signal 428, is inverted and provided as an input of the tri-state inverter 452. When the tri-state inverter 452 is enabled by a "drive read bit-line" signal labeled DRBL, an input 482, is inverted and provided as an input 454 of the inverter 456. The inverter 456 inverts the input 454 and provides a signal 458 to the tri-state inverter 462, the buffer 474, and the tri-state inverter 460. The inverter 456 and the tri-state inverter 460 work together as an input latch that stores previous data. When the tri-state inverter 462 is enabled by RCK, the signal 458, is inverted and provided as an input 464 of the inverter 466 and the inverter 472. The inverter 466 inverts the input 464 and provides a signal 468 to the tri-state inverter 470. The inverter 466 and the tri-state inverter 470 work together as an input latch that stores previous data. The inverter 472 inverts the input 464 and provides an output signal 478. In this way, data is written on a write bit line and read back from a read bit line using both write control circuitry 410 and read control circuitry 415. In other words, data is written "synchronously," i.e., on a clock edge, "through" the control circuitry from write to read.

Figure 6:
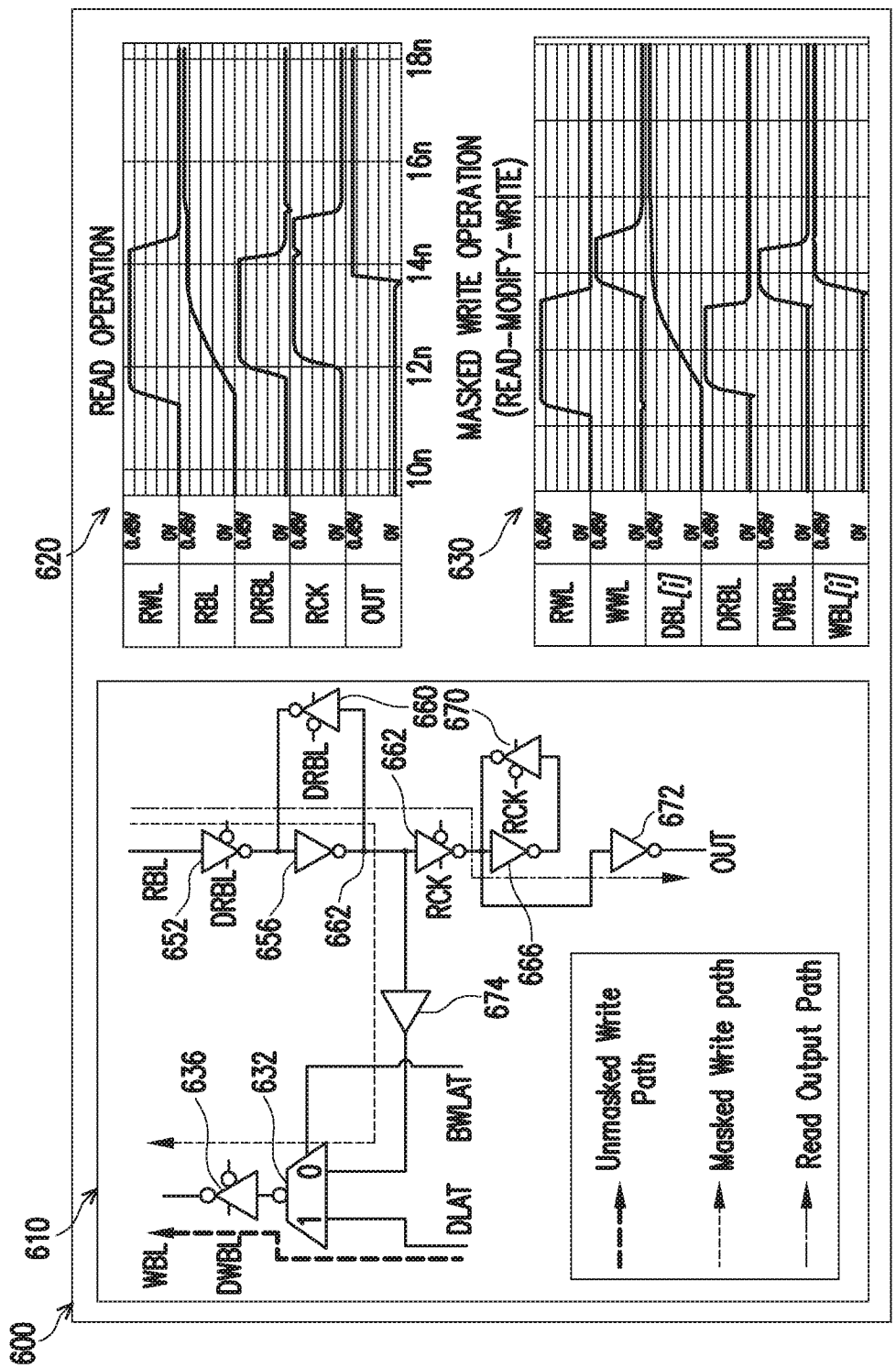
FIG. 6 depicts an example set of waveforms during a read operation and a masked write operation, in accordance with some embodiments.

FIG. 6 is a diagram 600 depicting control circuitry 610, example waveforms for a read operation 620 and example waveforms for a masked write operation 630, in accordance with some embodiments. The lines on the control circuitry 610 indicate signal paths for an unmasked write operation, the masked write operation, and the read operation. The waveforms for the read operation are based on the signal flow through the read port circuitry and the read control circuitry. The read control circuitry in FIG. 6 has been simplified from the read control circuitry in FIG. 4 for clarity.

Read control circuitry on the right-hand side of the control circuitry 610 comprises a tri-state inverter 652, an inverter 656, a tri-state inverter 660, a tri-state inverter 662, an inverter 666, a tri-state inverter 670, an inverter 672, and a buffer 674. The RBL signal is provided as an input of the read control circuitry, specifically of the tri-state inverter 652. When the tri-state inverter 652 is enabled by DRBL, the input is inverted and provided as an input of the inverter 656. The inverter 656 inverts the input and provides a signal to the tri-state inverter 662, the buffer 674, and the tri-state inverter 660. The inverter 656 and the tri-state inverter 660 work together as an input latch that stores previous data. When the tri-state inverter 662 is enabled by an edge of the read latch clock RCK, the signal is inverted and provided as an input of the inverter 666 and the inverter 672. The inverter 666 inverts the input and provides a signal to the tri-state inverter 670. The inverter 666 and the tri-state inverter 670 work together as an input latch that stores previous data.

In one example, the control circuitry of FIG. 6 operates with the bit-cell of FIG. 1. The RWL signal is an input to the read port circuitry 120 in the 12T bit-cell. The RBL signal is an output of the read port circuitry 120. If RWL is high, RBL will be the inverted value of BLB_IN. Thus, if BLB_IN is low, RBL is high. RBL begins to switch states shortly after RWL goes high. As the RWL signal goes low, transistors 148 and 150 in the read-port circuit 120 will turn off, and the RBL will retain its previous value. The RBL signal is inverted four times before it reaches the output. One of the inversion operations is driven by the control signal DRBL, which is input to the tri-state inverter 652. One of the inversion operations is driven by the RCK read clock signal, which is input to the tri-state inverter 662. The Q signal goes high after about a 2 ns delay. The Q signal is labeled as OUT in the read operation circuitry.

Write control circuitry on the left-hand side of the control circuitry 610 comprises a inverting multiplexer 632 and a tri-state inverter 636. The write control circuitry in FIG. 6 has been simplified from the read control circuitry in FIG. 6 for clarity. The waveforms for the masked write operation are based on the signal flow through the write control circuitry. The masked write operation consists of a read operation, a modify operation, and a write operation. With reference to FIG. 1, during a read operation, when RWL is high, RBL, or RBl[i], will be the inverted value of BLB_IN. Thus, if BLB_IN is low, RBL, or RBL[i], is high. RBL begins to switch states shortly after RWL goes high. As the RWL signal goes low, transistors 148 and 150 in the read-port circuit 120 will turn off, and the RBL will retain its previous value. The RBL signal is inverted two times before it reaches the input of the buffer 674. Because the tri-state inverter is driven by the control signal DRBL, the signal RBL is inverted by the tri-state inverter 652 upon DRBL going high, then inverted again by the inverter 656, then buffered by the buffer 674 to the input of the inverting multiplexer 632.

During a modify operation, if the control signal BWLAT to the inverting multiplexer 632 is low, the output of the buffer 674 is inverted by the inverting multiplexer 632 and then inverted by the tri-state inverter 636 upon DWBL going high. Thus, WBL[i] takes the value of RBL[i] after DWBL goes high. Referring back to FIG. 1, during the write operation, WWL goes high, and the BL_IN node internal to the write port circuit 110 (not shown in the diagram), takes on the value of WBL[i].

Figure 7:
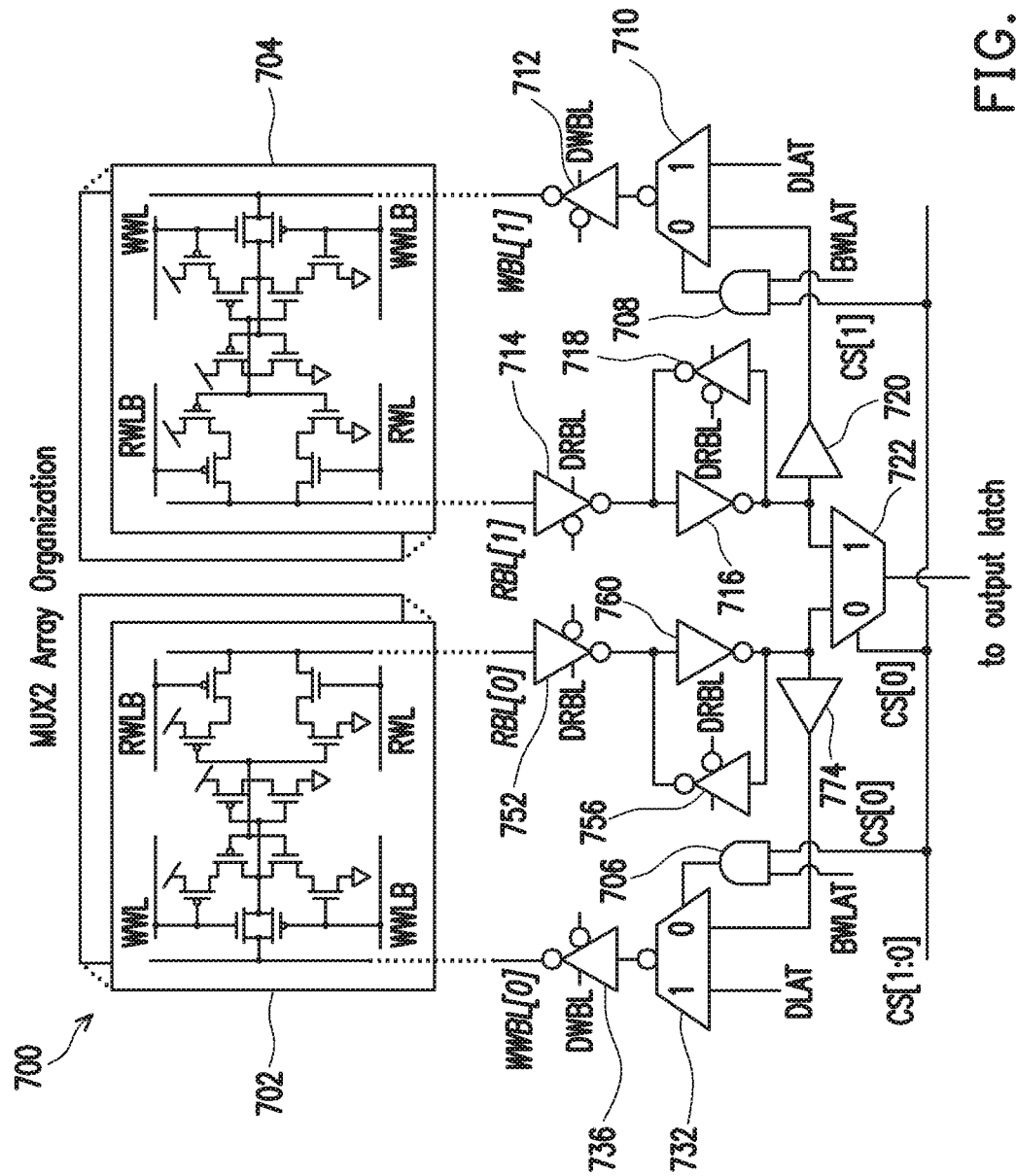
FIG. 7 depicts an example circuit that provides column multiplexing for both read and write operations, in accordance with some embodiments.

FIG. 7 depicts an example circuit 600 that provides column multiplexing for both read and write operations, in accordance with some embodiments. The example circuit 600 is shown for only two bit cells 602 and 604 for simplification, but the design is not limited to two bit cells and can be extended to support a larger number of bit cells. The control circuitry in FIG. 7 has been simplified from the read control circuitry in FIG. 6 for clarity.

Whereas in FIG. 6, the signal BWLAT was provided directly to the inverting multiplexer as a control signal, in FIG. 7, BWLAT and a column select signal CS are inputs to an AND gate 706. If a particular column is to be selected, the corresponding bit of CS will be high. For the write operation, selected columns go through a normal write operation. Thus, if the column for bit-cell 702 is to be selected, the CS[0] signal will be high. When the BWLAT signal is high, the AND gate 706 will output a logic 1 to the inverting multiplexer 732, which will invert the DLAT signal onto its output and provide the inverted DLAT to the input of the tri-state inverter 736. The tri-state inverter 736 inverts the inverted DLAT signal upon the DWBL signal going high. A value of the DLAT signal is thus driven onto the write bit line WBL[0].

For the write operation, unselected columns result in a read-modify-write operation, such that data is not altered. If a particular column is to be unselected, the corresponding bit of CS will be low. Thus, if the column for bit-cell 704 is to be unselected, the CS[1] signal will be low. When the BWLAT signal is high, the AND gate 708 will output a logic 0 to the inverting multiplexer 710, which will invert the buffered signal from the corresponding read control circuitry onto its output and provide the inverted buffered signal from the corresponding read control circuitry to the input of the tri-state inverter 712. The tri-state inverter 712 inverts the inverted buffered signal from the corresponding read control circuitry upon the DWBL signal going high. The buffered signal from the corresponding read control circuitry is thus driven onto the write bit line WBL[1].

For the read operation, data from all columns are read, and read data is multiplexed from selected column to output. If a particular column is to be selected, the corresponding bit of CS will be high. Thus, if the column for bit-cell 602 is to be selected, the CS[0] signal will be low. The signal RBL[0] will be inverted by the tri-state inverter 652 upon DRBL going high. The inverter 660 will further invert the output of the tri-state inverter 652. A tri-state inverter 656 in combination with the inverter 660 operates as a latch. A buffer 674 buffers the output of the tri-state inverter 652 onto the input signal of the inverting multiplexer 622. Thus, RBL[0] will be driven onto the input signal of the inverting multiplexer 622. When the CS[0] signal is low, RBL[0] is driven to the output latch.

Conversely, if the column for bit-cell 604 is to be selected, the CS[0] signal will be high. The signal RBL[1] will be inverted by the tri-state inverter 614 upon DRBL going high. The inverter 616 will further invert the output of the tri-state inverter 614. A tri-state inverter 618 in combination with the inverter 616 operates as a latch. A buffer 620 buffers the output of the tri-state inverter 616—onto an input signal of the inverting multiplexer 610. Thus, RBL[1] will be driven onto the input signal of the inverting multiplexer 610. When the CS[0] signal is high, RBL[1] is driven to the output latch.

Figure 8:
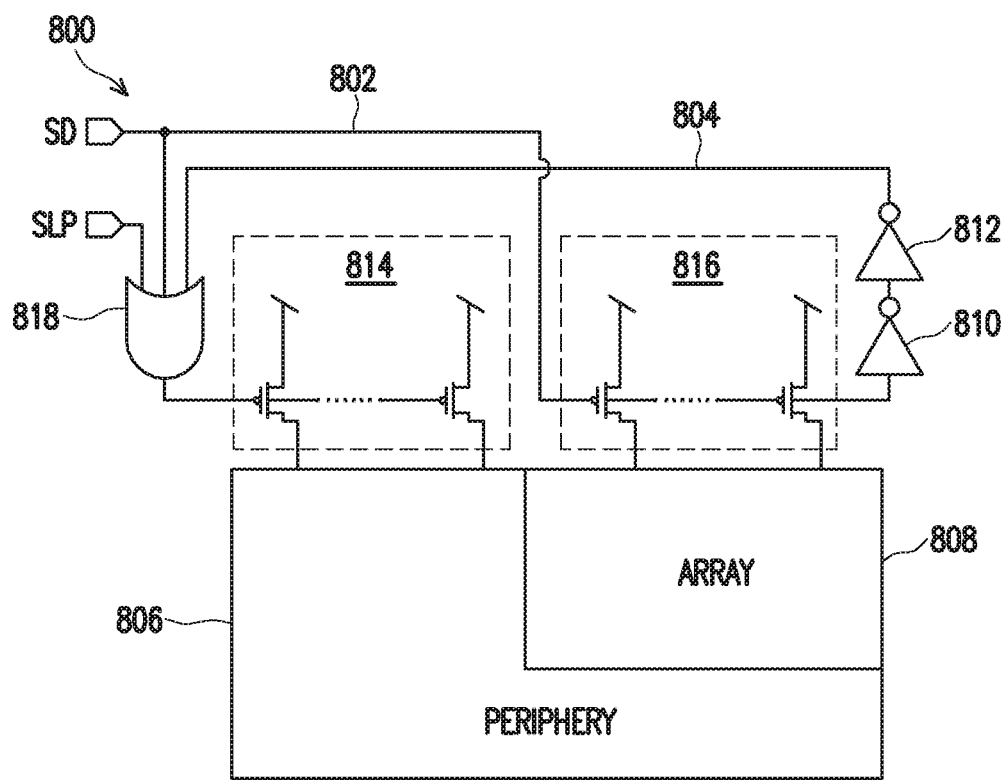
FIG. 8 depicts exemplary power management circuitry, in accordance with some embodiments.

FIG. 8 depicts exemplary power management circuitry 800, in accordance with some embodiments. Power management can provide leakage savings by shutting down certain parts of the memory, i.e., periphery header circuitry 814 and/or array header circuitry 816. Array 808 comprises an array of bit-cells, while periphery 806 refers to the control circuitry.

Three modes of operation related to power management are used and are shown in table 810. Table 810 indicates for each mode whether the array headers are ON/OFF and whether the periphery headers are ON/OFF. The modes are controlled by two signals SD 802 and SLP 804. These two signals SD 802 and SLP 804 are provided to an OR logic gate 818. A twice inverted output of the array header circuitry 816 is also provided as a third input to the OR logic gate 818. The output of the array header circuitry 816 is twice inverted through inverters 810 and 812. SD 802 is further provided to gates of the array header circuitry 816.

The first mode—normal mode—occurs when neither SLP or SD are high. When this occurs, array header circuitry 816 and periphery header circuitry 814 are ON. The second mode—sleep mode—occurs when SLP is high, such that periphery header circuitry 814 is OFF, array header circuitry 816 is ON. The third mode—shut-down—occurs when SD is high, such that array header circuitry 816 and periphery header circuitry 814 are OFF.

Figure 9:
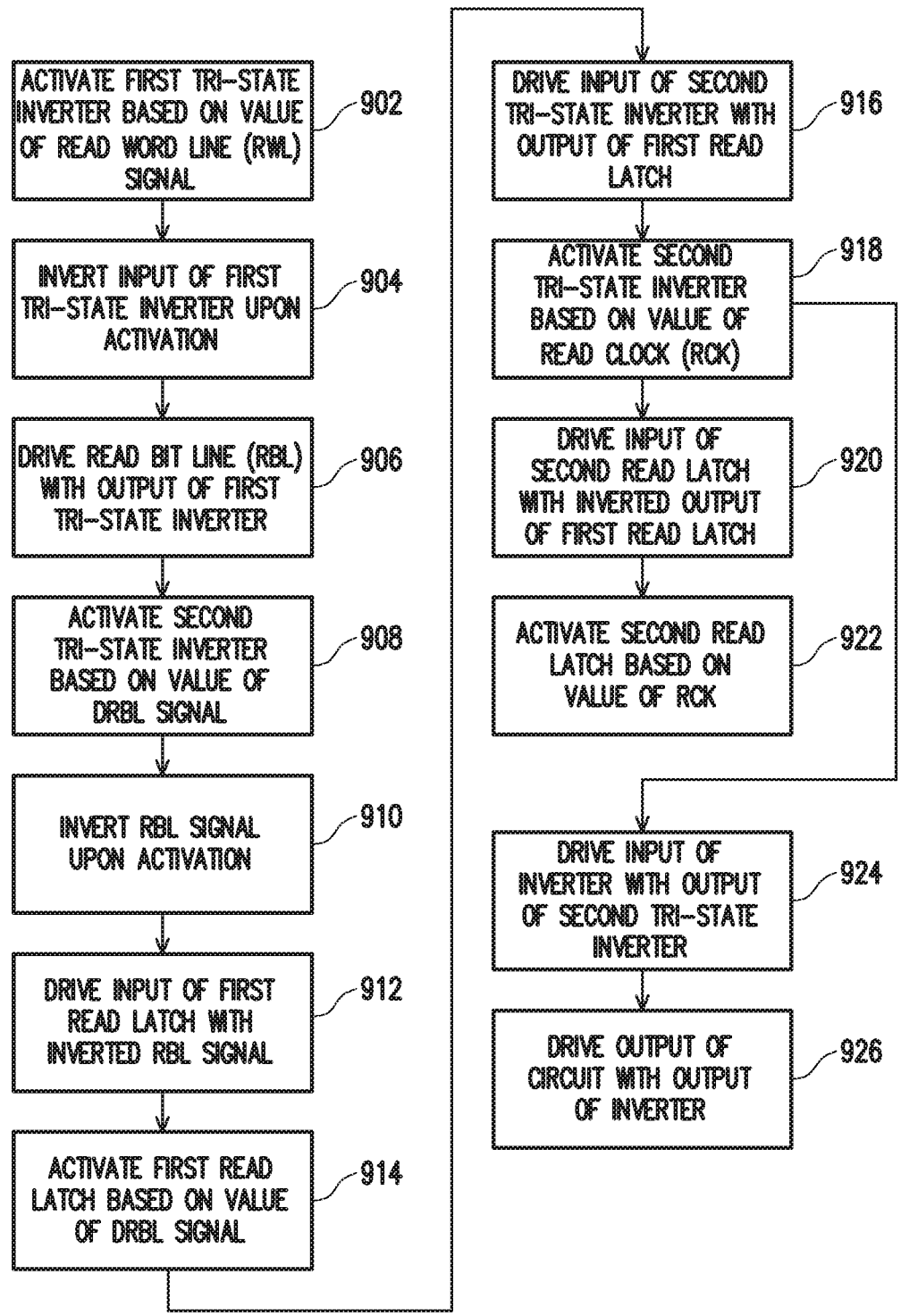
FIG. 9 depicts a flow diagram for a read operation, in accordance with some embodiments.

FIG. 9 depicts a flow diagram for a read operation, in accordance with some embodiments. At 902, a first tri-state inverter is activated based on a value of a read word line (RWL) signal. An input to the first tri-state inverter is inverted upon activation at 904. At 906, a read-bit line (RBL) is driven with an output of the first tri-state inverter. A second tri-state inverter is activated based on a value of a DRBL signal at 908. At 910, the RBL signal is inverted upon activation. An input of a first read latch is driven with the inverted RBL signal at 912. At 914, a first read latch is activated based on a value of the DRBL signal. An input of the second tri-state inverter is driven with an output of the first read latch at 916. At 918, the second tri-state inverter is activated based on a value of a read clock (RCK). An input of a second read latch is driven with the inverted output of the first read latch at 920. At 922, the second read latch is activated based on the value of RCK. An input of an inverter is driven with the output of the second tri-state inverter at 924. At 926, an output is driven with the output of the inverter.

Figure 10A:
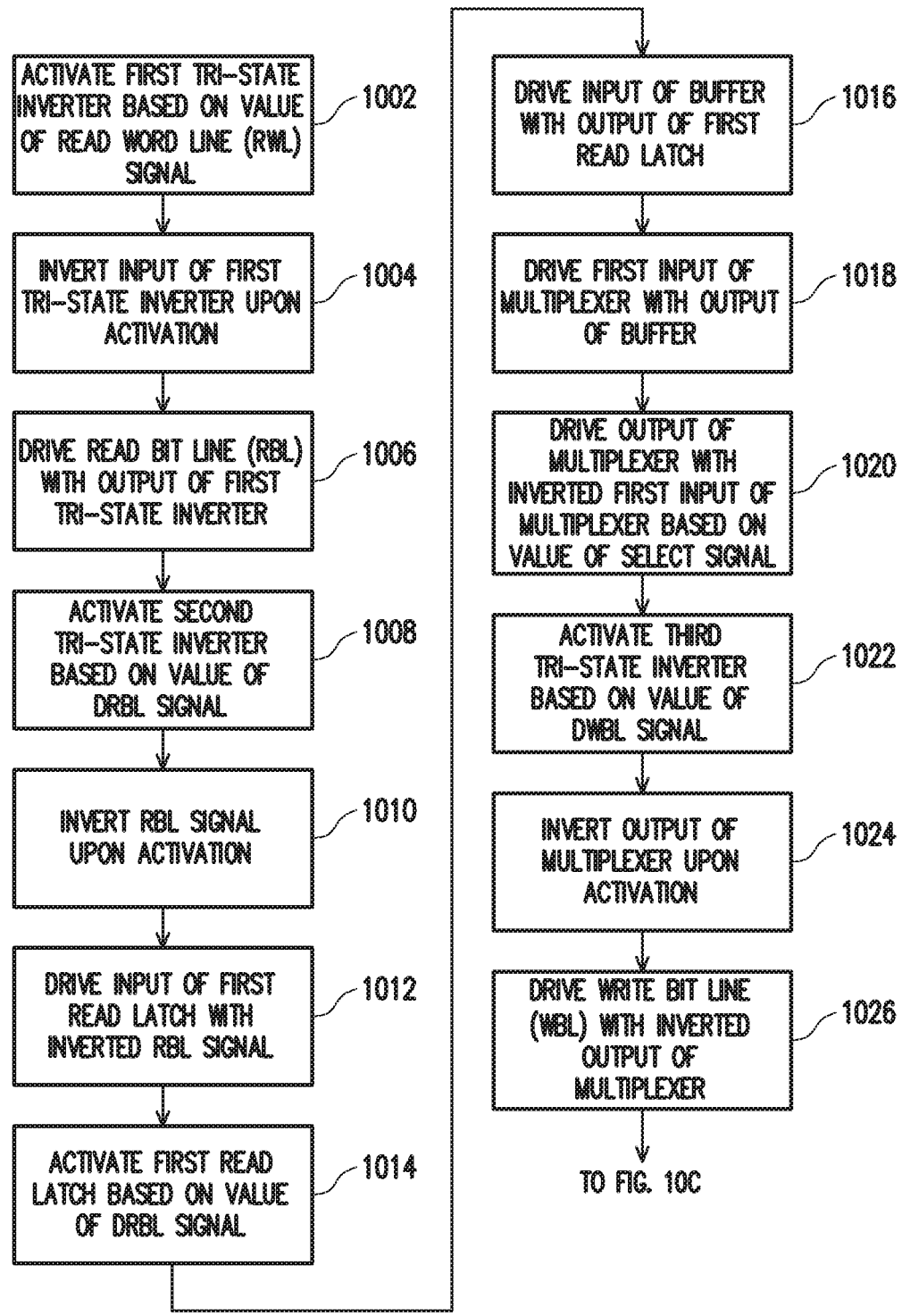
FIGS. 10A and 10C in combination depict a flow diagram for a masked write operation, in accordance with some embodiments.
Figure 10B:
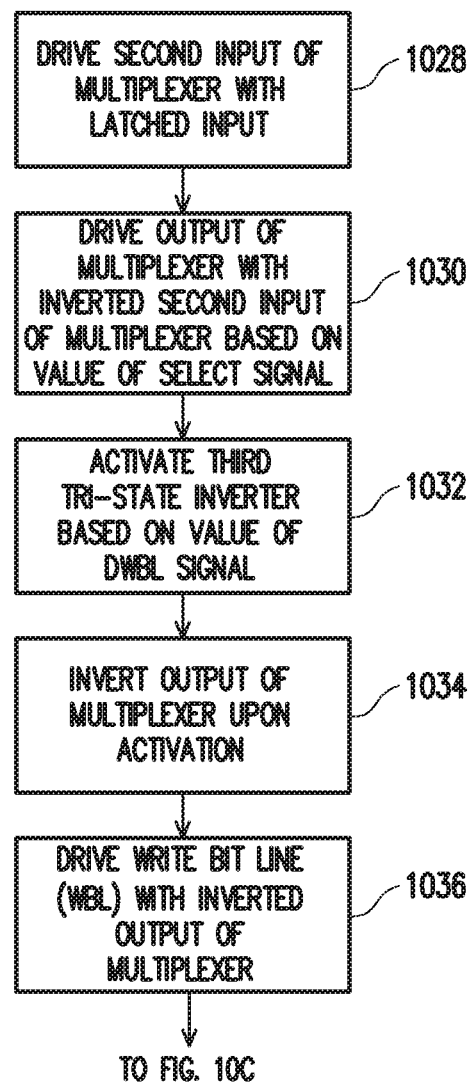
Figure 10C:
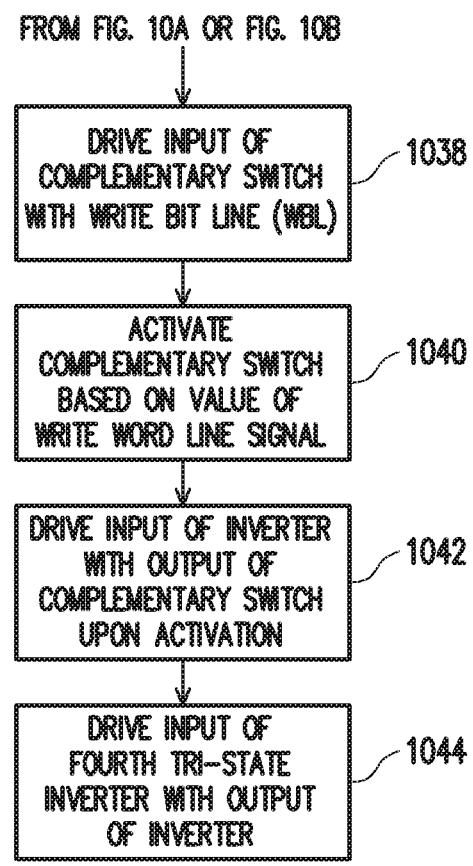

FIGS. 10A and 10C in combination depict a flow diagram for a masked write operation, in accordance with some embodiments. At 1002, a first tri-state inverter is activated based on a value of a read word line (RWL) signal. An input of the first tri-state inverter is inverted upon activation at 1004. At 1006, a read bit-line (RBL) signal is driven with an output of the first tri-state inverter. A second tri-state inverter is activated based on a value of a DRBL signal at 1008. At 1010, the RBL signal is inverted upon activation. An input of a first-read latch is driven with an inverted RBL signal at 1012. At 1014, the first read latch is activated based on the value of the DRBL signal. An input of a buffer is driven with the output of the first read latch at 1016. At 1018, a first input of a multiplexer is driven with the output of the buffer. An output of the multiplexer is driven with an inverted first input of the multiplexer based on a value of a select signal at 1020. At 1022, a third tri-state inverter is activated based on a value of a DWBL signal. The output of the multiplexer is inverted upon activation at 1024. At 1026, the write bit-line (WBL) is driven with the inverted output of the multiplexer. At 1038, an input of a complementary switch is driven with the WBL signal. The complementary switch is activated based on a value of a write word-line (WWL) signal at 1040. At 1042, an input of an inverter is driven with an output of the complementary switch upon activation. An input of a fourth tri-state inverter is driven with an output of the inverter at 1044.

FIGS. 10B and 10C in combination depict a flow diagram for an unmasked write operation, in accordance with some embodiments. At 1028, a second input of a multiplexer is driven with a latched input. An output of the multiplexer is driven with an inverted second input of the multiplexer based on a value of a select signal at 1030. At 1032, a third tri-state inverter is activated based on a value of a DWBL signal. An output of the multiplexer is inverted upon activation at 1034. At 1036, a write bit-line (WBL) is driven with an inverted output of the multiplexer. At 1038, an input of a complementary switch is driven with the WBL signal. The complementary switch is activated based on a value of a write word-line (WWL) signal at 1040. At 1042, an input of an inverter is driven with an output of the complementary switch upon activation. An input of a fourth tri-state inverter is driven with an output of the inverter at 1044.

Systems and methods as described herein can offer a low voltage bit-cell design that minimizes problems faced by other low voltage bit-cell designs. The low voltage bit-cell design can make use of features such as bit-write support and a feedback path between read-control circuitry and write-control circuitry to overcome problems of readability, read-stability, and writability. The read-port circuitry can operate at ULVT, while the write-port circuitry can operate at LVT, thereby lowering the overall voltage operation.

In one embodiment, a bit-cell, comprises a write-port circuit activated by a first threshold voltage and a read-port circuit activated by a second threshold voltage. The write-port circuit comprises a first group of four transistors collectively forming a tri-state inverter. The first group comprises: a first transistor connected to a supply voltage, a first input of the first transistor connected to a write word-line signal; a second transistor having a second input; a third transistor having a third input connected to the second input; and a fourth transistor connected to a ground signal, a fourth input of the fourth transistor connected to a write word-line complement signal. The read-port circuit comprises a second group of four transistors, wherein the read-port circuit is activated by a second threshold voltage, and wherein the write-port circuit is coupled to the read-port circuit.

In another embodiment, a bit-cell comprises a read-port circuit and a write-port circuit. The read-port circuit comprises four transistors. The write-port circuit comprises eight transistors. A first multiplexer circuit is coupled to the write-port circuit and the first multiplexer circuit. A second multiplexer circuit is coupled to the read-port circuit. A power management circuit configured to minimize power leakage from the system.

In yet another embodiment, a method for writing to and reading from a bit cell is provided. A voltage is generated on a write bit line. A complementary switch is activated in a write-port circuit based on a write word line signal. Based on the activating, a write bit line signal is driven onto an internal bit line node. A voltage is inverted on the internal bit-line in node, the inverting based on a first threshold voltage. The inverted voltage is driven onto the input of a tri-state inverter. The tri-state inverter inverts the inverted voltage back to the write bit line signal. The inverting based on the write word line signal being greater than a first threshold voltage. A value is retained on the internal bit line node based on a deactivation of the write word line signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
   a bit-cell, comprising:
      a write-port circuit comprising eight transistors, wherein the write-port circuit is activated by a first threshold voltage; and
      a read-port circuit comprising four transistors, wherein the read-port circuit is activated by a second threshold voltage, wherein the first threshold voltage is a higher voltage than a second threshold voltage;
      a first multiplexer circuit coupled to the write-port circuit, wherein a second multiplexer circuit is coupled to the first multiplexer circuit;
      the second multiplexer circuit coupled to the read-port circuit; and
      a power management circuit configured to minimize power leakage from the system.

2. The system of claim 1, comprising:
   wherein the read-port circuit and the write-port circuit are coupled to each other, such that an output from the write-port circuit is connected to an input of the read-port circuit, wherein the first threshold voltage and the second threshold voltage are each selected from a group comprising: low threshold voltage (LVT) and ultra low threshold voltage (ULVT), and high threshold voltage (HVT).

3. The system of claim 1, wherein the write-port circuit further comprises:

a complementary switch;
a tri-state inverter coupled to the complementary switch; and
an inverter coupled to the complementary switch and the tri-state inverter.

4. The system of claim 3, wherein:
a first input of the complementary switch is connected to a write-word line;
a first output of the complementary switch is connected to a second input of the inverter;
a second output of the inverter is connected to a third input of the tri-state inverter;
a third output of the tri-state inverter is connected to the second input of the inverter; and
a fourth input of the tri-state inverter is connected to the write-word line.

5. The system of claim 1, wherein the read-port circuit operates at the first threshold voltage, the write-port circuit operates at the second threshold voltage, and the first threshold voltage is different from the second threshold voltage.

6. The system of claim 4, the first multiplexer circuit further comprising:
an inverting multiplexer having a fifth input connected to a latched data input, a sixth input connected to a buffered output from the read-port circuit, and a control signal connected to a latched bit-write input; and
a tri-state inverter having an input connected to an output of the inverting multiplexer and an output connected to a write bit-line, the write bit-line coupled to the complementary switch.

7. The system of claim 1, wherein the power management circuit is configured to operate in one of three modes: normal, sleep, and shut-down.

8. The system of claim 1, wherein the first multiplexer circuit and the second multiplexer circuit included in a periphery circuit are not provided with power during sleep mode and shut-down mode.

9. A bit cell, comprising:
a write-port circuit comprising eight transistors, wherein the write-port circuit is activated by a first threshold voltage; and
a read-port circuit comprising four transistors, wherein the read-port circuit is activated by a second threshold voltage, wherein the first threshold voltage is a higher voltage than a second threshold voltage;
a first multiplexer circuit coupled to the write-port circuit, wherein a second multiplexer circuit is coupled to the first multiplexer circuit; and
the second multiplexer circuit coupled to the read-port circuit.

10. The bit cell of claim 9, comprising:
wherein the read-port circuit and the write-port circuit are coupled to each other, such that an output from the write-port circuit is connected to an input of the read-port circuit, wherein the first threshold voltage and the second threshold voltage are each selected from a group comprising: low threshold voltage (LVT) and ultra low threshold voltage (ULVT), and high threshold voltage (HVT).

11. The bit cell of claim 9, wherein the write-port circuit further comprises:
a complementary switch;
a tri-state inverter coupled to the complementary switch; and
an inverter coupled to the complementary switch and the tri-state inverter.

12. The bit cell of claim 11, wherein:
a first input of the complementary switch is connected to a write-word line;
a first output of the complementary switch is connected to a second input of the inverter;
a second output of the inverter is connected to a third input of the tri-state inverter;
a third output of the tri-state inverter is connected to the second input of the inverter; and
a fourth input of the tri-state inverter is connected to the write-word line.

13. The bit cell of claim 9, wherein the read-port circuit operates at the first threshold voltage, the write-port circuit operates at the second threshold voltage, and the first threshold voltage is different from the second threshold voltage.

14. The bit cell of claim 12, the first multiplexer circuit further comprising:
an inverting multiplexer having a fifth input connected to a latched data input, a sixth input connected to a buffered output from the read-port circuit, and a control signal connected to a latched bit-write input; and
a tri-state inverter having an input connected to an output of the inverting multiplexer and an output connected to a write bit-line, the write bit-line coupled to the complementary switch.

15. The bit cell of claim 9, further comprising:
a power management circuit configured to minimize power leakage from the bit cell, wherein the power management circuit is configured to operate in one of three modes: normal, sleep, and shut-down.

16. The bit cell of claim 9, wherein the first multiplexer circuit and the second multiplexer circuit included in a periphery circuit are not provided with power during sleep mode and shut-down mode.

17. A memory circuit, comprising:
a write-port circuit activated by a first threshold voltage, the write-port circuit comprising at least eight transistors;
a read-port circuit coupled to the write-port circuit, the read-port circuit comprising at least four transistors, wherein the read-port circuit is activated by a second threshold voltage, wherein the first threshold voltage is a higher voltage than a second threshold voltage; and
two multiplexers, each of the two multiplexers being connected to one of the write-port circuit and read-port circuit, and to each other.

18. The memory circuit of claim 17, wherein the read-port circuit and the write-port circuit are coupled to each other, such that an output from the write-port circuit is connected to an input of the read-port circuit, wherein the first threshold voltage and the second threshold voltage are each selected from a group comprising: low threshold voltage (LVT) and ultra low threshold voltage (ULVT), and high threshold voltage (HVT).

19. The memory circuit of claim 17, wherein the write-port circuit further comprises:
a complementary switch;
a tri-state inverter coupled to the complementary switch; and
an inverter coupled to the complementary switch and the tri-state inverter.

20. The memory circuit of claim 19, wherein:
a first input of the complementary switch is connected to a write-word line;
a first output of the complementary switch is connected to a second input of the inverter;
a second output of the inverter is connected to a third input of the tri-state inverter;

a third output of the tri-state inverter is connected to the second input of the inverter; and a fourth input of the tri-state inverter is connected to the write-word line.

\* \* \* \* \*